United States Patent
Tabara et al.

[19]

[11] Patent Number: 6,150,250
[45] Date of Patent: Nov. 21, 2000

[54] CONDUCTIVE LAYER FORMING METHOD USING ETCHING MASK WITH DIRECTION <200>

[75] Inventors: Suguru Tabara; Satoshi Hibino, both of Hamamatsu, Japan

[73] Assignee: Yamaha Corporation, Japan

[21] Appl. No.: 09/186,811

[22] Filed: Nov. 5, 1998

Related U.S. Application Data

[63] Continuation-in-part of application No. 08/898,417, Jul. 3, 1997, Pat. No. 5,910,021, which is a continuation of application No. 08/498,537, Jul. 5, 1995, abandoned.

[30] Foreign Application Priority Data

Nov. 7, 1997 [JP] Japan .................................. 9-322094

[51] Int. Cl.$^7$ .................. H01L 21/3205; H01C 21/4763
[52] U.S. Cl. .................. 438/592; 438/198; 438/714; 438/717; 438/669; 438/636; 438/952
[58] Field of Search .................. 438/198, 714, 438/717, 592, 669, 636, 952

[56] References Cited

U.S. PATENT DOCUMENTS

| | | |
|---|---|---|
| 5,160,407 | 11/1992 | Latchford et al. . |
| 5,302,538 | 4/1994 | Ishikawa et al. . |
| 5,326,431 | 7/1994 | Kadomura . |
| 5,378,653 | 1/1995 | Yanagida . |
| 5,403,781 | 4/1995 | Matsumoto et al. . |
| 5,514,621 | 5/1996 | Tabara . |
| 5,910,021 | 6/1999 | Tabara . |
| 6,075,293 | 3/1999 | Li et al. . |

FOREIGN PATENT DOCUMENTS 1-817758   1/1996   Japan .

OTHER PUBLICATIONS

Elstner et al, "Structure and properties of titanium nitride thin films deposited at low temperatures using direct current magnetron sputtering," J. Vac. Sci. & Tech. A: Vac., Surf., and Films, vol. 12, Iss., 2, pp. 476–483 Mar. 1994.

Hashimoto et al, "Bias–induced structure transistion in reactively sputtered TiN films," Appl. Phys. Lett. vol., 54, Iss., 2, 120–122, Jan. 9, 1989.

Yuichi Matsui, et al., "Highly Oxidation–Resistant TiN Barrier Layers for Ferroelctric Capacitors", Jpn. J. Appl. Phys., vol. 36, pp. 1586–1588 (1997); and.

Yuichi Sato, et al., "Properties of TiN Thin Films By Vacuum Annealing", Second Preliminary Lecture Prints, The Institute of Electronics, Information and Communication Engineers, Spring National Meeting, pp. 2–160 (1988).

*Primary Examiner*—John F. Niebling
*Assistant Examiner*—Jonathan Hack
*Attorney, Agent, or Firm*—Ostrolenk, Faber, Gerb & Soffen, LLP

[57] ABSTRACT

An electrode material layer of a WSi$_2$/polysilicon lamination layer and a conductive material layer for antireflection made of TiN or TiON and containing the direction <200> are sequentially deposited on a gate insulating film. The conductive material layer is patterned through dry etching using a resist layer as a mask to leave a portion of the conductive material layer. The resist layer may be as thin as capable of patterning the conductive material layer. After the resist layer is removed, the electrode material layer is patterned through dry etching using the conductive material layer as a mask to leave a portion of the electrode material layer. A lamination of the left electrode material layer and conductive material layer is used as a gate electrode layer. A lamination of the resist layer and conductive material layer may be used as a mask.

19 Claims, 9 Drawing Sheets

CONDUCTIVE LAYER FORMING METHOD USING ETCHING MASK WITH DIRECTION <200>

CROSS-REFERENCE TO RELATED APPLICATIONS

This application is a continuation-in-part application of U.S. patent application Ser. No. 08/898,417 filed on Jul. 3, 1997, now U.S. Pat. No. 5,910,021, which is a continuation of application Ser. No. 08/498,537 filed on Jul. 5, 1995, now abandoned.

BACKGROUND OF THE INVENTION a) Field of the Invention

The present invention relates to a method of forming a conductive layer of fine pattern to be used as an electrode or wiring of a semiconductor device or the like. More particularly, the invention relates to a method of manufacturing a conductive lamination layer of fine pattern by dry-etching the conductive layer made of refractory metal silicide such as tungsten suicide ($WSi_2$) at least for an uppermost layer of the conductive lamination layer by using as a mask a TiN or TiON layer containing the direction <200> of Miller indices notation.

b) Description of the Related Art

In a known conventional method of forming a gate electrode layer of fine pattern made of polycide, a polycide layer such as a laminated film ($WSi_2$/polysilicon layer) of a $WSi_2$ film stacked upon a polysilicon layer $WSi_2$ is dry-etched by using an antireflection layer made of TiN or TiON as a mask (e.g., refer to JP-A-No. 8-17758).

In this specification, "TiON" does not mean that the compositions of "O" and "N" are 1:1, but that it is represented by a general chemical formula "$TiO_xN_y$," and x and y change with dose amounts of O and N in a TiON layer deposited, for example, by sputtering.

In order to make $TiO_xN_y$ have the function of a conductive film, it is necessary to set the resistance value of $TiO_xN_y$ lower than a predetermined value. To this end, it is preferable that the values x and y satisfy the following conditions.

$0 \leq x \leq 0.4$ $0.8 \leq y \leq 1$ $x/2+y=1$

Also in this specification, the compositions of "W" and "Si" of "$WSi_2$" are not limited to 1:2, but it is represented by a general chemical formula "$W_mSi_n$" and m and n change with the compositions of a sputtering target $W_mSi_n$. $W_mSi_n$ rich in silicon such as $WSi_{2.7}$ is often used in practice.

SUMMARY OF THE INVENTION

It is an object of the present invention to provide a laminated conductive film forming method capable of forming a laminated conductive film of fine pattern having a highly precise dimension and made of refractory metal silicide at least for an uppermost layer of the laminated conductive layer.

According to one aspect of the present invention, there is provided a method of forming a conductive layer comprising the steps of: (a) forming a first conductive lamination layer on an insulating film covering a substrate, the first conductive lamination layer being made of refractory metal silicide at least at an uppermost layer of the first conductive lamination layer; (b) forming a second conductive layer for antireflection on the first conductive lamination layer through photolithography, the second conductive layer being made of TiN or TiON and containing a direction <200> of the Miller indices notation; (c) forming a resist film having a desired pattern on the second conductive layer through photolithography; (d) patterning the second conductive layer through dry etching using the resist layer as a mask to partially leave the second conductive layer; and (e) patterning the first conductive lamination layer through dry etching using the resist layer and/or the left portion of the second conductive layer as a mask to partially leave the first conductive lamination layer, wherein a lamination of a left portion of the first conductive lamination layer and the left portion of the second conductive layer is used as a conductive layer for an electrode or a wiring layer.

An electrode material lamination layer made of refractory metal silicide such as $WSi_2$ at least at the uppermost layer thereof is dry-etched by using as a mask a conductive material layer for antireflection made of TiN or TiON and containing the direction <200>. It is therefore possible to form a fine pattern conductive material layer made of refractory metal silicide and having a good dimension precision.

Furthermore, if a lamination of the antireflection conductive material layer and the resist layer is used as an etching mask, an independent process of removing the resist layer becomes unnecessary.

DETAILED DESCRIPTION OF THE PREFERRED EMBODIMENTS

Figure 1:
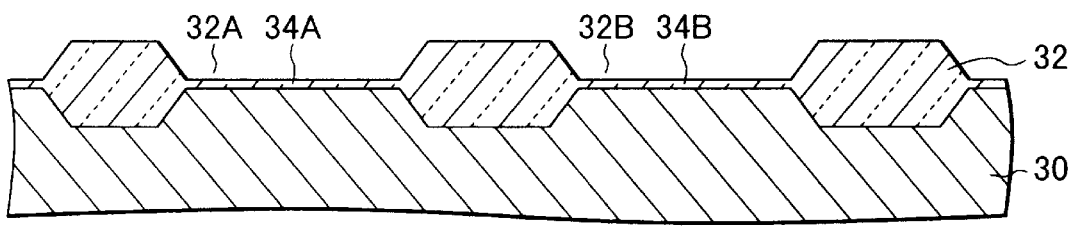
FIGS. 1 to 15 are cross sectional views of a substrate illustrating a method of manufacturing a MOS IC according to an embodiment of the invention.

According to the studies made by the inventors, the above-described conventional method is associated with the problem that a TiN (or TiON) layer is etched when a $WSi_2$ layer or a $WSi_2$/polysilicon lamination layer is dry-etched, and the TiN (or TiON) layer cannot function sufficiently as the mask.

More specifically, when a polysilicon layer is dry-etched with plasma of $Cl_2+O_2$ by using a TiN layer as a mask, reactions of the following formulae occur.

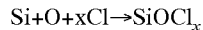
$Si+O+xCl \rightarrow SiOCl_x$

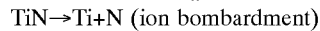
$TiN \rightarrow Ti+N$ (ion bombardment)

$Ti+2O \rightarrow TiO_2$ (deposition)

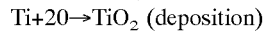
$Ti+xCl \rightarrow TiCl_x$ (etching)

Ti–N coupling is cut by ion bombardment, and thereafter contention reactions occur, one being a reaction (deposition) of forming a Ti oxide film oxidized by O and the other being a reaction (etching) of etching Ti with Cl. Since the oxide film is formed on the surface of the TiN layer through the deposition reaction, the etching rate of the TiN layer is lowered. The TiN layer can therefore be used as the mask.

When a WSi$_2$/polysilicon lamination layer is dry-etched with plasma of Cl$_2$+O$_2$ by using a TiN layer as a mask, reactions of the following formulae occur.

$WSi_n + xO + yCl \rightarrow WOCl_4 + nSiOCl_z$

TiN→Ti+N (ion bombardment)

Ti+2O→TiO$_2$ (deposition)

Ti+xCl→TiCl$_x$ (etching)

As compared to the polysilicon layer, the amount of necessary oxygen is larger. Therefore, the supply amount of oxygen for forming the Ti oxide film through a reaction between Ti and O after the Ti—N coupling is cut by ion bombardment, becomes insufficient and the oxide film for suppressing the etching cannot be formed sufficiently.

It has been found that TiN conventionally used as an etching mask has the direction <111>.

The inventors have found that an etching precision can be improved by using a TiN layer or TiON layer containing the direction <200> as a mask instead of using a TiN layer containing the direction <111>.

According to an embodiment of the present invention, there is provided a method of forming a conductive layer comprising the steps of: (a) forming a first conductive lamination layer on an insulating film covering a substrate, the first conductive lamination layer being made of refractory metal silicide at least at an uppermost layer of the first conductive lamination layer; (b) forming a second conductive layer for antireflection on the first conductive lamination layer through photolithography, the second conductive layer being made of TiN or TiON and containing a direction <200> of the Miller indices notation; (c) forming a resist film having a desired pattern on the second conductive layer through photolithography; (d) patterning the second conductive layer through dry etching using the resist layer as a mask to partially leave the second conductive layer; and (e) after the resist layer is removed, patterning the first conductive lamination layer through dry etching using the left portion of the second conductive layer as a mask to partially leave the first conductive lamination layer, wherein a lamination of a left portion of the first conductive lamination layer and the left portion of the second conductive layer is used as a conductive layer for an electrode or a wiring layer.

In this conductive layer forming method, the resist layer may have a thickness as thin as sufficient for patterning the second conductive layer and as thin as insufficient for patterning the first conductive layer. The first conductive layer may be patterned through dry etching using a lamination of the resist layer and the left portion of the second conductive layer as a mask, without removing the resist layer after the second conductive layer is patterned, to thereby leave the portion of the first conductive layer and remove the resist layer.

With this method, the antireflection second conductive layer made of TiN or TiON and containing the direction <200> is formed on the first conductive layer made of refractory metal silicide at least at the uppermost layer thereof, and the resist layer having a desired pattern is formed through photolithography on the second conductive layer. The second conductive layer is patterned through dry etching using the resist layer as a mask to leave the portion of the second conductive layer.

The second conductive layer functions as an antireflection layer during a photolithography process so that a fine resist pattern can be formed. For example, the thickness of the second conductive layer is set to about 30 to 50 nm. Since the resist layer can be made as thin as capable of patterning the second conductive layer, the depth of focus for the photolithography process can be improved. The second conductive layer can therefore be patterned finely.

After the resist layer is removed, the first conductive layer is patterned through dry etching using the left portion of the second conductive layer as a mask to leave the portion of the first conductive layer. During this etching process, the etching mask constituted of the portion of the second conductive layer is thin, so that the microloading effects are suppressed and the patterning dimension precision can be improved.

If a resist layer made of insulating material is etched, electric charges are accumulated on the surface of the resist layer during the etching and the electron shading effects become worse. By using the left portion of the second conductive layer as an etching mask, electric charges are prevented from being accumulated on the surface of the etching mask and the electron shading effects and the microloading effects can be suppressed.

A conductive layer for an electrode or a wiring layer of a fine pattern made of a lamination of the left portions of the first and second conductive layers can therefore be formed with a good dimension precision.

Although a TiN or TiON layer containing the direction <111> is used with the conventional techniques, in the embodiment a TiN or TiON layer containing the direction <200> is used as an etching mask when the first conductive layer is patterned. The reason for this is as follows.

A TiN layer containing the direction <200> has a lower reaction degree and a lower etching rate than a TiN layer having the direction <111> (e.g., refer to Jpn. J. Appl. Phys. Vol. 36, p. 1586, Tab. 1, 2). This may be ascribed to a strong Ti—N coupling of the direction <200>. The TiN layer containing the direction <200> is therefore suitable for an etching mask.

TiON layer containing the direction <200> has a coupling energy relation of Ti—O>Ti—N>Ti—Cl. It can therefore be expected that the more a layer has the Ti—O coupling, the etching rate becomes lower. It is considered that the TiON layer contains the Ti—O coupling and most of the Ti—O couplings are present in the form of TiO$_2$. From the coupling energy relation of Ti—O>Ti—N>Ti—Cl, TiO$_2$ is not voluntarily etched with Cl radicals. The TiON layer containing the direction <200> has therefore a low etching rate and is therefor e suitable for an etching mask.

For example, a TiON layer having an oxygen content of 20 at. % can be considered as having 10% of TiO$_2$ and 90% of Ti—N among Ti in the layer. The TiON layer has therefore the compositions near a TiN layer, and a low reaction and a low etching rate similar to the TiN layer.

If an electrode material lamination layer made of refractory metal silicide such as WSi$_2$ at least at the uppermost layer thereof is dry-etched by using as a mask a conductive material layer for antireflection made of TiN or TiON and containing the direction <200>, it becomes possible to form a fine pattern conductive material layer made of refractory metal silicide and having a good dimension precision.

Furthermore, if a lamination of the antireflection conductive material layer and the resist layer is used as an etching mask, an independent process of removing the resist layer becomes unnecessary.

FIGS. 1 to 15 are cross sectional views of a substrate illustrating a method of manufacturing a MOS IC according to an embodiment of the invention. The processes (1) to (15) of the manufacture method corresponding to the drawing numbers will be described in this order.

(1) As shown in FIG. 1, on the surface of a semiconductor substrate 30 made of, e.g., silicon, a field insulating film 32 made of silicon oxide is formed through local oxidation of silicon (LOCOS). The insulating film 32 has openings 32A and 32B defining active regions. Gate insulating films 34A and 34B made of silicon oxide are formed by oxidizing the surfaces of the substrate in the openings 32A and 32B. The insulating films 34A and 34B may be a silicon nitride ($Si_3N_4$) film.

Figure 2:
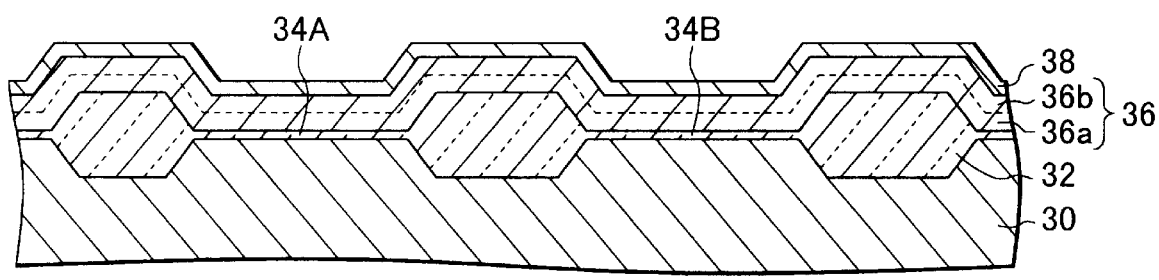

(2) As shown in FIG. 2, an electrode material layer 36 for gate electrodes is deposited over the substrate, covering the insulating films 32, 34A, 34B. Thereafter, a conductive material layer 38 to be used for antireflection and as an etching mask is deposited on the electrode material layer 36. As the electrode material layer 36, a $WSi_2$/polysilicon lamination layer 36a, 36b is formed through chemical vapor deposition (CVD), and as the conductive material layer 38, a TiON layer containing the direction <200> is formed through reactive sputtering or a TiN layer containing the direction <200> may be formed. For example, a TiN film containing the direction <200> is formed as follows. A TiN film deposited by using a radio frequency ion plating system is subjected to heat treatment at a temperature of 1000° C. in a vacuum state. For this technique, refer to, for example, "Second Preliminary Lecture Prints", the Institute of Electronics, Information and Communication Engineers, Spring National Meeting, at page 160, 1988, which is herein incorporated by reference.

The conductive material layer 38 made of a TiN layer or a TiON layer may have a minimum thickness as thin as sufficient for the antireflection effects. If light of i or g line is used for the exposure, the thickness of about 30 to 50 nm is sufficient.

Figure 16A:
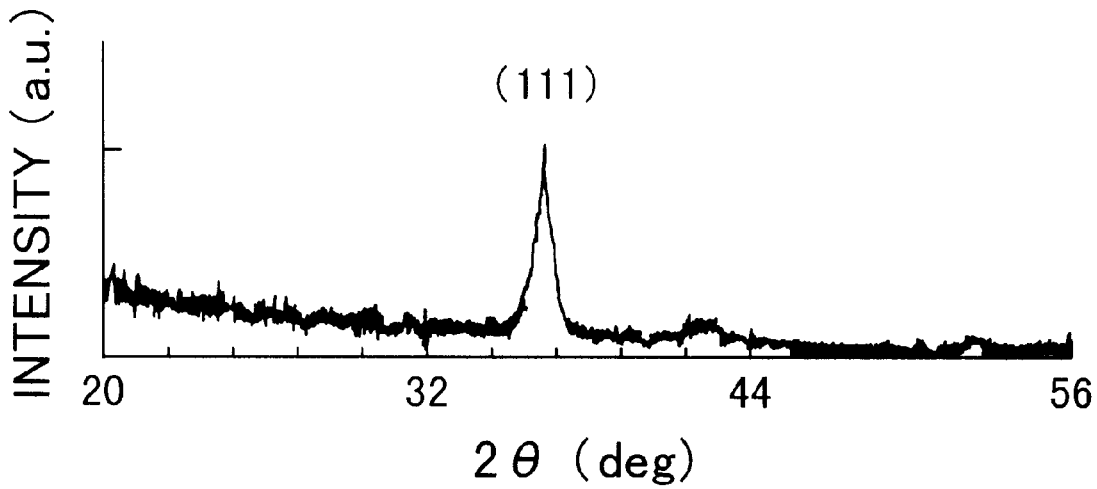
FIGS. 16A and 16B are graphs showing x-ray diffraction patterns of a TiN layer and a TiON layer deposited through reactive sputtering.
Figure 16B:
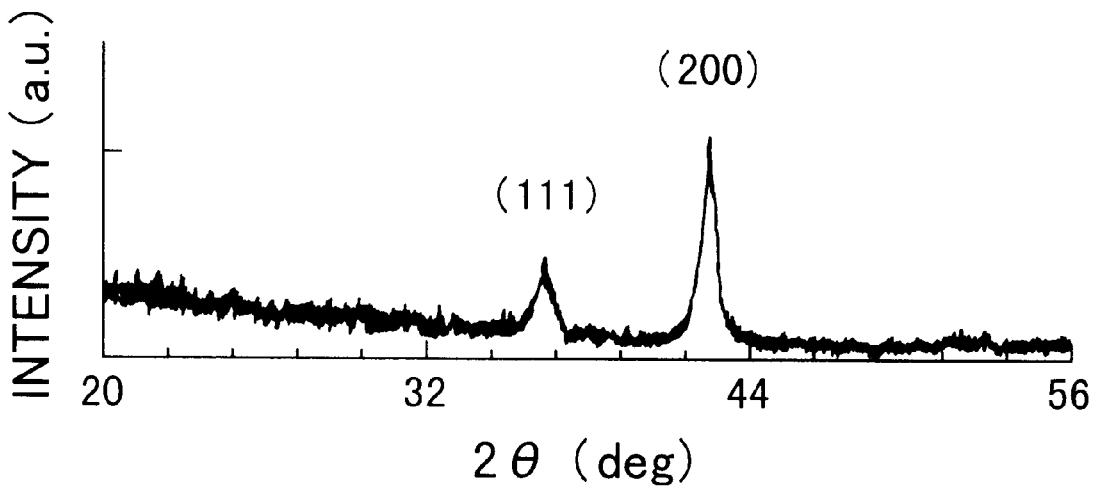

A TiON layer containing the direction <200> was formed through reactive sputtering. For comparison, a TiN layer containing the direction <200> was formed through reactive sputtering. FIGS. 16A and 16B are graphs showing x-ray diffraction patterns of the TiN and TiON layers formed. FIG. 16A shows the x-ray diffraction pattern of the TiN layer (oxygen contents: 5 at. %), and FIG. 16B shows the x-ray diffraction pattern of the TiON layer (oxygen contents: 20 at. %). The abscissa represents 2θ degrees and the ordinate represents an intensity a.u. As described earlier, the TiON layer having the oxygen contents of 20 at. % has $TiO_2$ at 10% and Ti—N at 90%, and its compositions are similar to a TiN layer. It can be said that the x-ray diffraction pattern of the TiON layer shown in FIG. 16B reflects the crystal structure of TiN. It is not necessary that the conductive material layer 38 is made of TiN or TiON having the direction <200> only, but the layer 38 may be made of TiN or TiON containing the direction <200>. The intensity at 2θ corresponding to the direction <200> of TiN or TiON is preferably 50% or more of the intensity at 2θ corresponding to the direction <111>, more preferably 100% or more, or much more preferably 150% or more.

Figure 3:
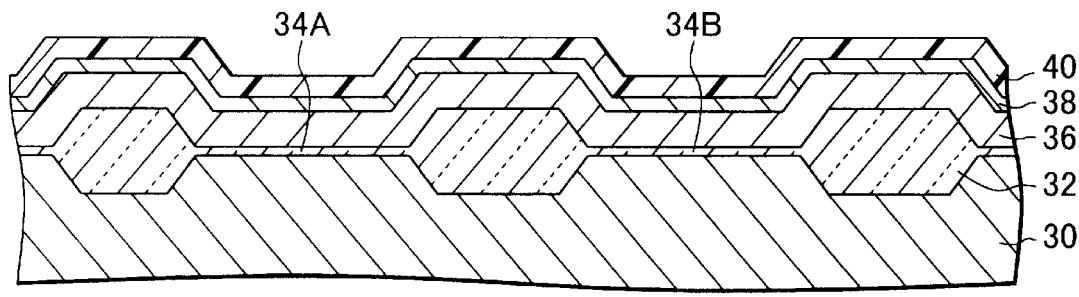
Figure 4:
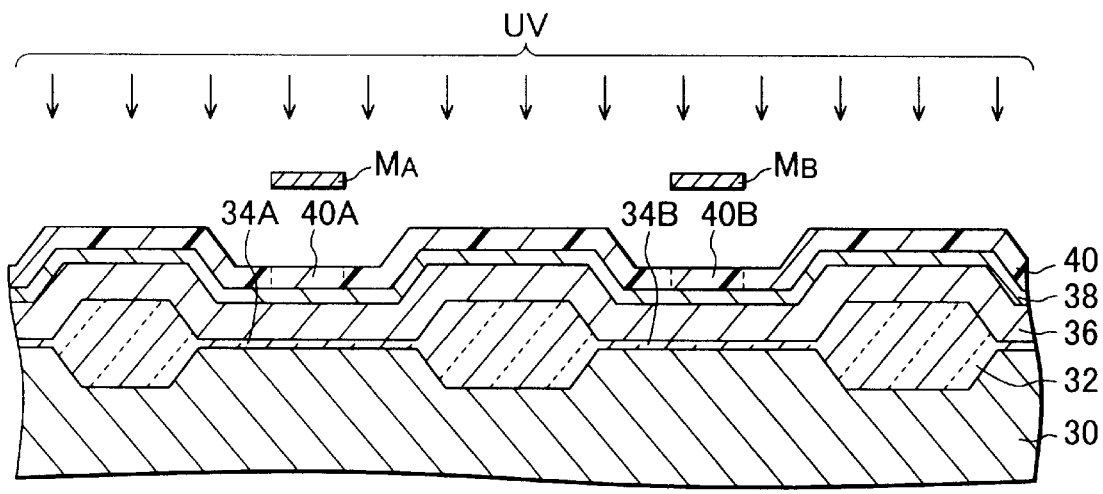
Figure 5:
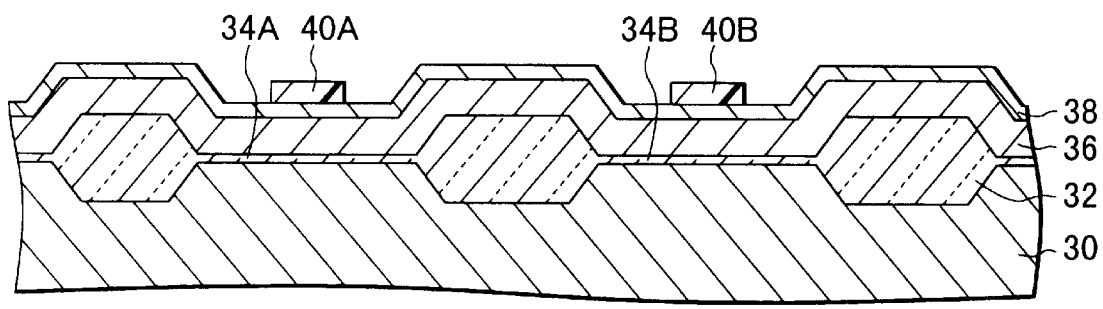

(3) In the processes shown in FIGS. 3 to 5, a desired resist pattern is formed through photolithography. First, as shown in FIG. 3, a resist layer 40 is formed over the substrate through spin coating or the like, the resist layer 40 covering the conductive material layer 38.

(4) Next, as shown in FIG. 4, an exposure process is executed. Namely, ultraviolet rays UV are exposed to the resist layer 40 via light shielding masks $M_A$ and $M_B$ having a desired gate electrode forming pattern. The ultraviolet rays UV are i or g line of a mercury lamp. The conductive material layer 38 functions as an antireflection layer.

(5) Next, a development process is performed to partially remove the resist layer 40 and leave resist layers 40A and 40B having a desired pattern as shown in FIG. 5. The resist layers 40A and 40B have a thickness as thin as sufficient for patterning the conductive layer 38 and as thin as insufficient for patterning the electrode material layer 36. For example, the thickness may be set to 0.5 $\mu$m. A resist pattern highly precise and/or fine can therefore be formed.

Figure 6:
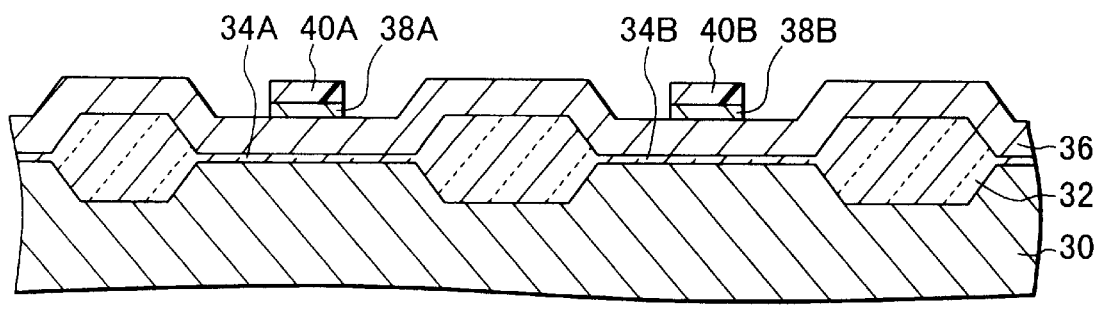

(6) The conductive material layer 38 is patterned through dry-etching by using the resist layers 40A and 40B as a mask to leave conductive material layers 38A and 38B (both part of the conductive material layer 38) as shown in FIG. 6. In this process, $Cl_2$ is used as the etching gas.

Figure 17:
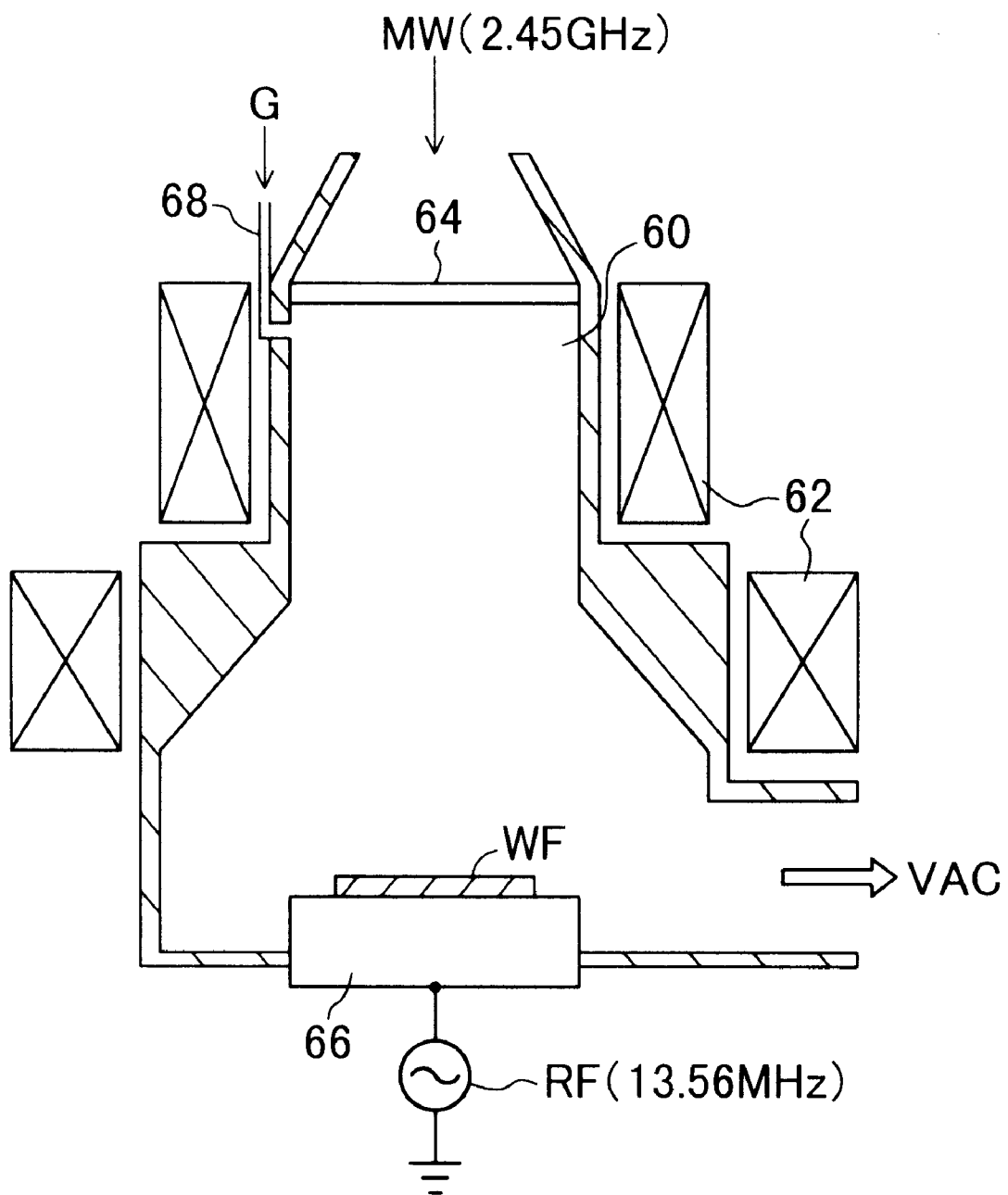
FIG. 17 is a cross sectional view showing an electron cyclotron resonance (ECR) plasma etcher used by the embodiment.

For example, the conductive material layer 38 was dry-etched by using an electron cyclotron resonance (ECR) plasma etcher such as shown in FIG. 17.

In the etcher shown in FIG. 17, solenoid coils 62 are mounted around a plasma chamber 60. Microwaves MW of 2.4 GHz are supplied via a quartz window 64 into the chamber 60. An electrode 66 for holding a wafer (substrate) to be processed is provided in the chamber 60. A radio frequency power source RF of 13.56 MHz is connected to the electrode 66. Etching gas G is supplied via a gas pipe 68 into the chamber 60. An evacuation system is coupled to the lower portion of the chamber 60. A synergetic reaction between microwaves and magnetic field in the chamber 60 can generate plasma of uniform and high density under a wide range of pressure. By adjusting the radio frequency power supplied to the electrode 66, the energy of ions incident upon the wafer WF can be controlled.

The etching conditions for dry-etching the conductive material layer 38 using the etcher shown in FIG. 17 were set as:

Pressure: 1 mTorr

Microwave Power: 600 W

Radio Frequency Power: 60 W

Gas Flow Rate: $Cl_2$=25 sccm

As the conductive layer 38, the TiON layer containing the direction <200> formed through reactive sputtering shown in FIG. 2 was dry-etched. For comparison, the TiN layer containing the direction <111> formed by the process shown in FIG. 2 was also dry-etched. The $O_2$ (oxygen) contents, densities, and etching rates of these layers are shown in Table 1. It can be understood that the etching rate of the TiON layer containing the direction <200> is lower than that of the TiN layer containing the direction <111>.

TABLE 1

| Layer 38 | $O_2$ Contents [at %] | Density [mol/$cm^2$] | Etching Rate [nm/min] |
|---|---|---|---|
| TiON | 20 | $6.3 \times 10^{-2}$ | 86 |
| TiN | 5 | $7.0 \times 10^{-2}$ | 133 |

Figure 7:
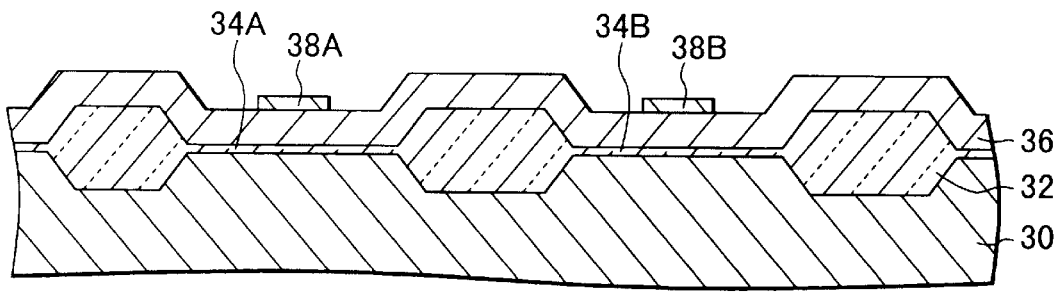

(7) As shown in FIG. 7, the resist layers 40A and 40B are removed by an ashing process. Alternatively, the resist layers 40A and 40B may be removed by a washing process using organic solvent or the like.

Figure 8:
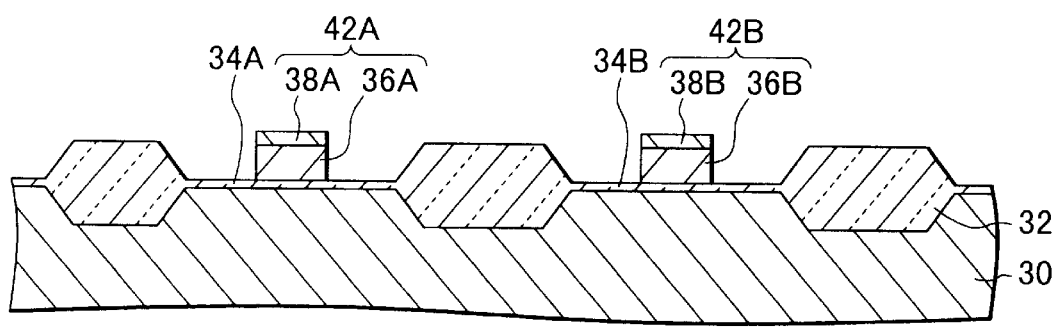

(8) The electrode material layer 36 is patterned through dry etching using the conductive material layers 38A and 38B as a mask to leave electrode material layers 36A and 36B (both part of the electrode material layer 36) as shown in FIG. 8. A lamination of the electrode material layer 36A and conductive material layer 38A constitutes a gate electrode layer 42A, and a lamination of the electrode material layer 36B and conductive material layer 38B constitutes a gate electrode layer 42B.

The electrode material layer 36 was dry-etched by using the etcher shown in FIG. 17. The structure of the films 34A and 42A (34B and 42B) was TiON ($O_2$ contents: 20 at. %)/$WSi_2$/polysilicon/$SiO_2$=40/150/150/15 nm. The etching conditions for $WSi_2$ were set as:
- Pressure: 1 mTorr
- Microwave Power: 1400 W
- Radio Frequency Power: 40 W
- Gas Flow Rate: $Cl_2/O_2$=25/11 sccm The main etching conditions for polysilicon were set as:
- Pressure: 1 mTorr
- Microwave Power: 1400 W
- Radio Frequency Power: 40 W
- Gas Flow Rate: $Cl_2/O_2$=25/9 sccm The over etching conditions for polysilicon were set similar to the main etching conditions for polysilicon, as:
- Pressure: 1 mTorr
- Microwave Power: 1400 W
- Radio Frequency Power: 40 W
- Gas Flow Rate: $Cl_2/O_2$=25/9 sccm With the above dry etching processes, the conductive material layers 38A and 38B made of TiON and containing the <200> direction were hardly etched, and they provided a sufficient function as the etching mask.

Figure 9:
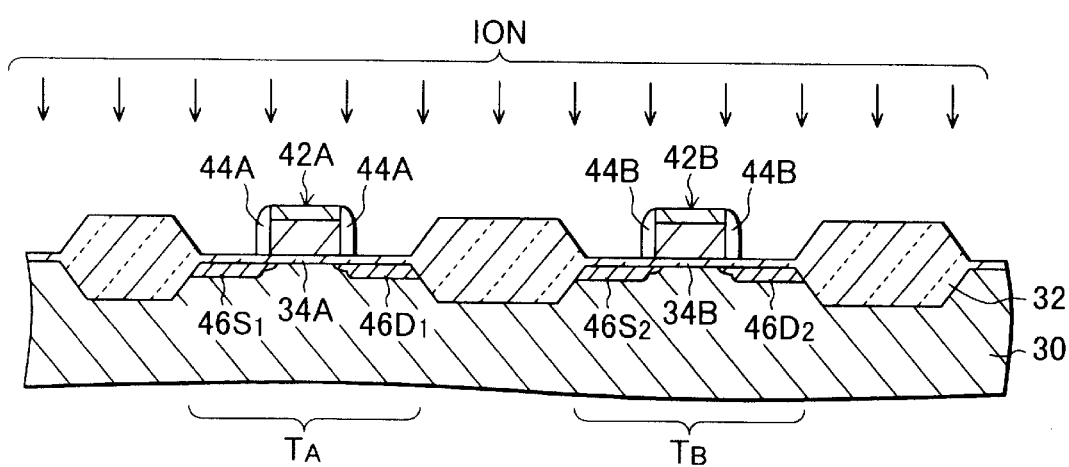

(9) As shown in FIG. 9, conductivity type imparting impurity ions ION are selectively implanted into a surface layer of the substrate by using the electrode layers 42A and 42B and insulating film 32 as a mask, to thereby form source/drain regions of low impurity concentration. After side spacers 44A and 44B are formed on the side walls of the electrode layers 42A and 42B, ions are selectively implanted in the manner similar to the above to form source/drain regions of high impurity concentration. The source regions $46S_1$ and $46S_2$ and drain regions $46D_1$ and $46D_2$ of a lightly doped drain (LDD) structure can therefore be formed. A MOS transistor $T_A$ has the gate electrode layer 42A, source region $46S_1$, and drain region $46D_1$, and a MOS transistor $T_B$ has the gate electrode layer 42B, source region $46S_2$, and drain region $46D_2$. CMOS transistors may also be formed. In this case, ions are implanted into an n-type transistor region by covering a p-type transistor region with a resist film, and ions are implanted into the p-type transistor region by covering the n-type transistor region with a resist film.

Figure 10:
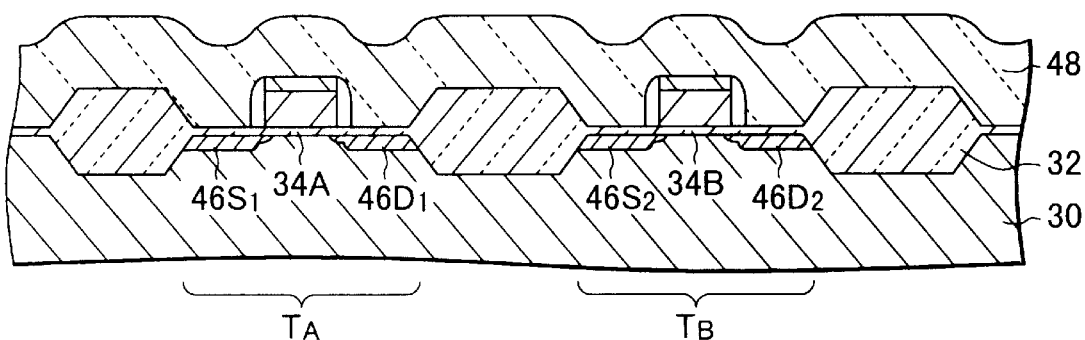

(10) As shown in FIG. 10, an interlayer insulating film 48 is formed over the substrate by CVD or the like, the film 48 covering the transistors $T_A$ and $T_B$ and insulating film 32. As the insulating film 48, a silicon oxide film, a silicon nitride film, a phosphosilicate glass (PSG) film, a borophosphosilicate glass (BPSG) film, or the like may be used.

Figure 11:
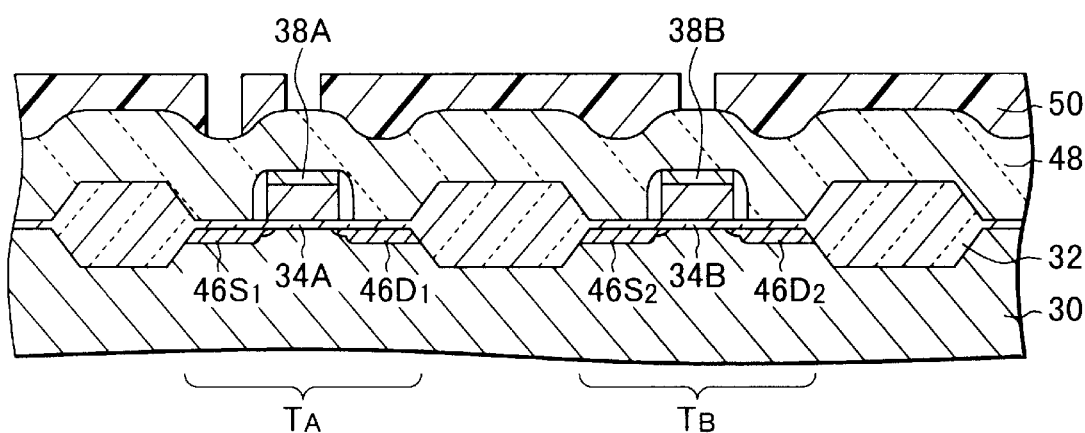

(11) As shown in FIG. 11, a resist layer 50 having openings for desired connection holes is formed on the insulating film 48 through photolithography. If the insulating film 48 is transparent, the conductive material layers 38A and 38B constituting the gate electrode layers function as an antireflection film when the resist layer 50 is exposed with light. Therefore, the dimension precision of the resist pattern is high in the area above the gate electrode layer.

Figure 12:
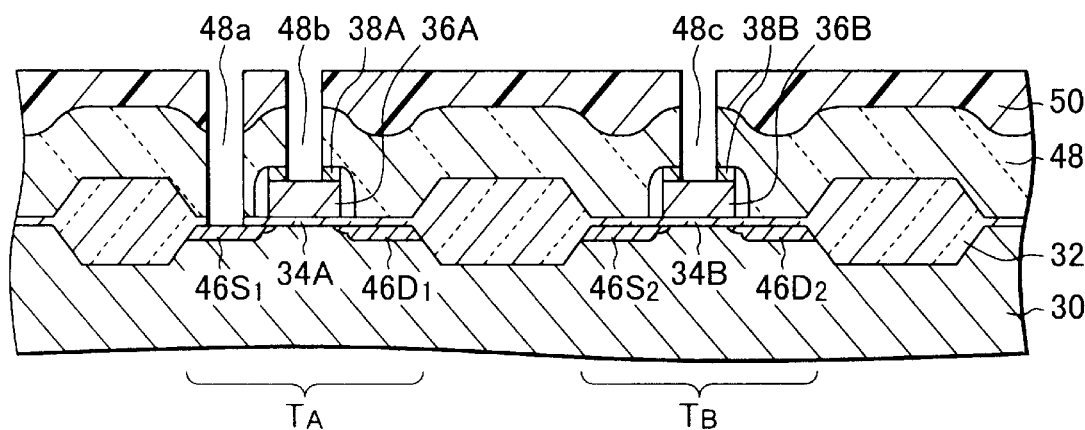

(12) A source connection hole 48a and gate connection holes 48b and 48c are formed through the insulating film 48 as shown in FIG. 12, through a dry etching process using the resist layer 50 as a mask. If there is an insulating film such as titanium oxide formed on the surface of the conductive material layers 38A and 38B, the connection holes 48b and 48c are formed reaching the conductive material layers 36A and 36B through the conductive material layers 38A and 38B in order to obtain good electrical contacts. If there is no insulating film formed on the surface of the conductive material layers 38A and 38B, the connection holes 48b and 48c may be formed reaching the surfaces of the conductive material layers 38A and 38B. Thereafter, the resist layer 50 is removed.

Figure 13:
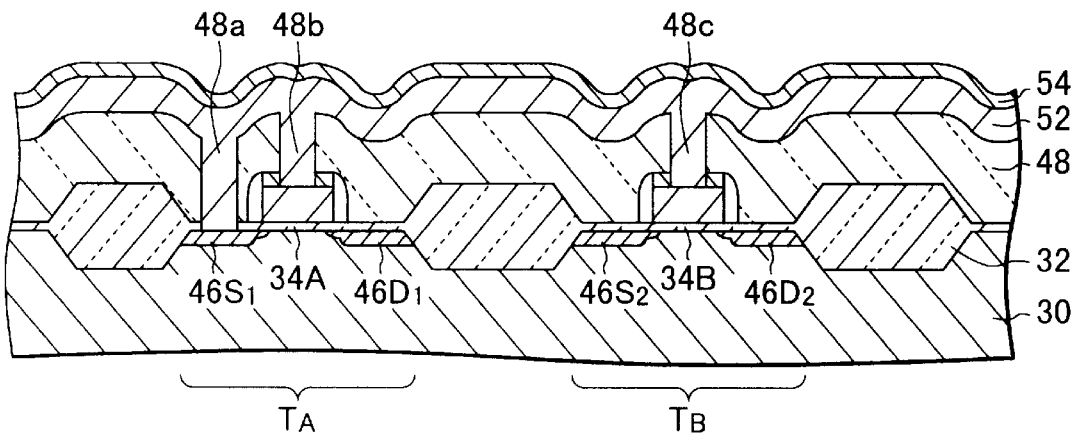

(13) As shown in FIG. 13, a wiring material layer 52 made of Al, Al alloy, or the like is deposited over the substrate, covering the insulating film 48 and filling the insides of the connection holes 48a to 48c. A conductive layer 54 made of TiN, TiON, or the like containing the direction <200> is formed on the wiring material layer 52 by the method similar to the processes shown in FIG. 54, the conductive material layer 54 being used for antireflection and as an etching mask.

Figure 14:
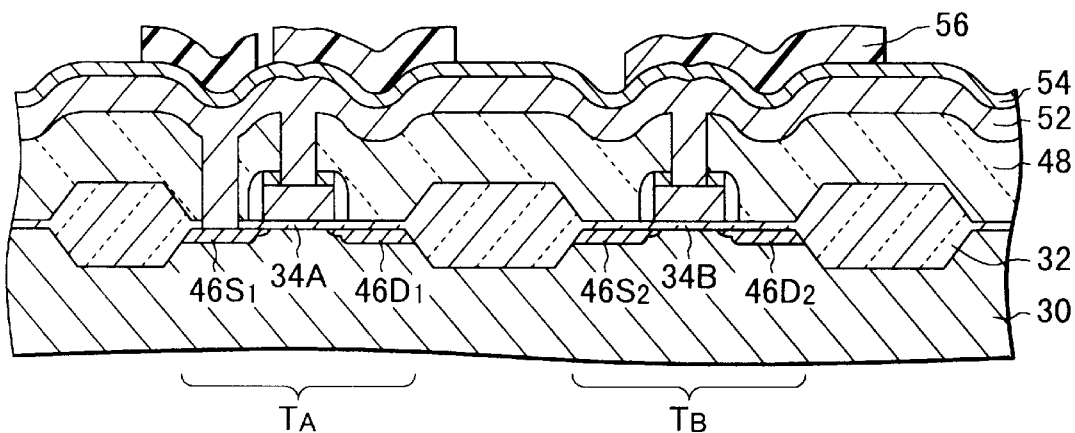

(14) As shown in FIG. 14, a resist layer 56 having a desired wiring pattern is formed on the conductive layer 54 by photolithography.

(15) The conductive material layer 54 is patterned through dry etching using the resist layer 56 as a mask, to thereby leave conductive material layers 54A, 54B, and 54C (all are part of the conductive material layers 54). After the resist layer 56 is removed, the wiring material layer 52 is patterned through dry etching using the conductive material layers 54A, 54B, and 54C as a mask, to thereby leave wiring material layers 52A, 52B, and 52C (all are part of the wiring material layer 52). A lamination of the wiring material layer 52A and conductive material layer 54A constitutes a source wiring layer $58S_1$ for the transistor $T_A$. A lamination of the wiring material layer 52B and conductive material layer 54B constitutes a gate wiring layer $58G_1$ for the transistor $T_A$. A lamination of the wiring material layer 52C and conductive material layer 54C constitutes a gate wiring layer $58G_2$ for the transistor $T_B$.

Figure 15:
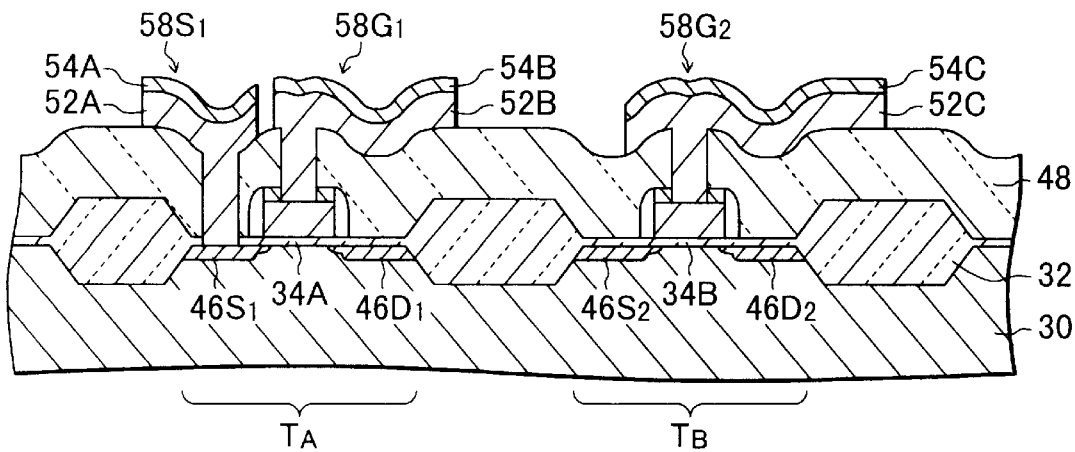

In the embodiment described above, the electrode material layer 36 and wiring material layer 52 are patterned after the resist layers are removed at the processes shown in FIGS. 8 and 15. The electrode material layer 36 and wiring material layer 52 may be patterned without removing the resist layers, by using the resist layers and conductive material layers 38A, 38B, 54A, 54B, and 54C as the mask. In this case, while the electrode material layer 36 and wiring material layer 52 are patterned through dry etching, the resist layers are removed by the dry etching. It is therefore unnecessary to use an independent process of removing the resist layer.

Figure 18:
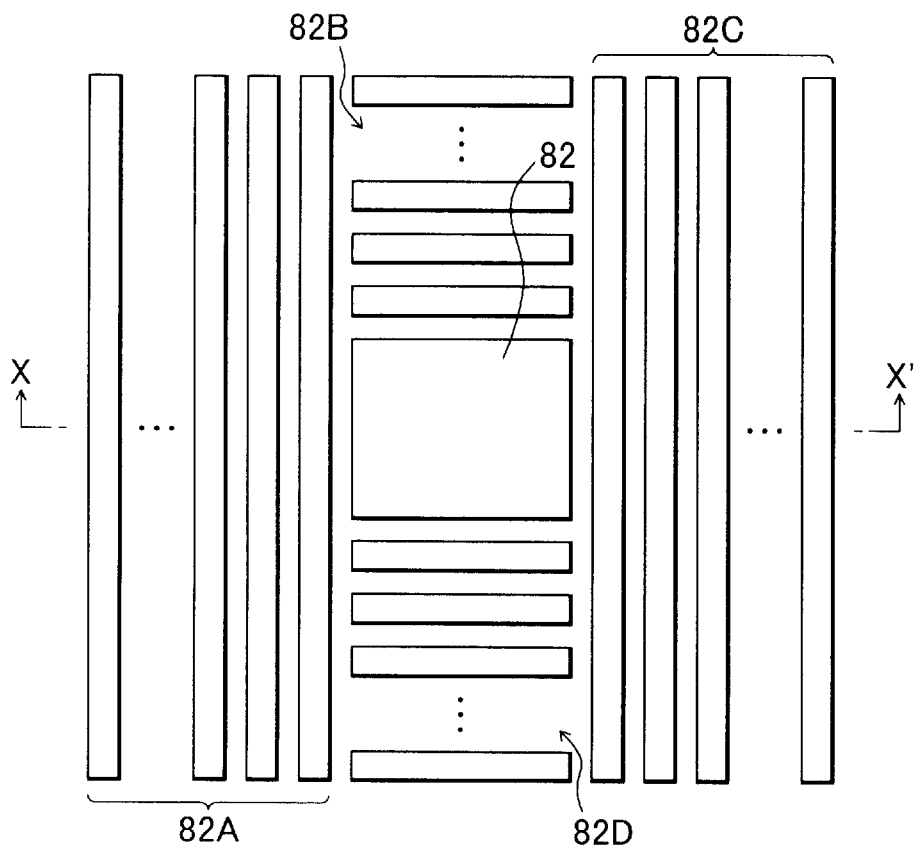
FIG. 18 is a plan view showing a resist pattern of a test sample used for electron shading damage tests.
Figure 19:
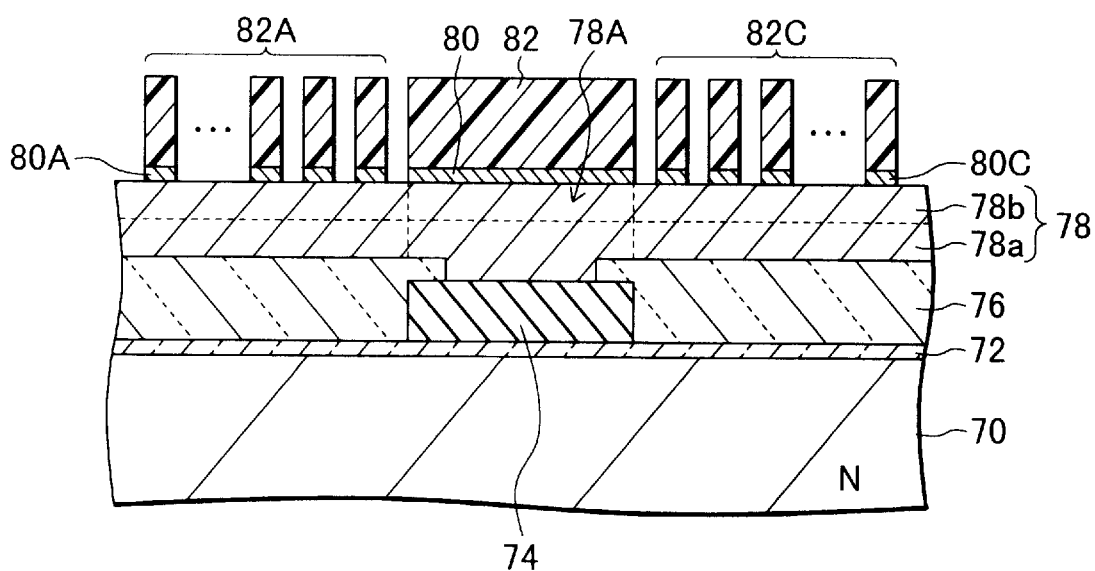
FIG. 19 is a cross sectional view of the substrate taken along line X-X' shown in FIG. 18.

Damage tests were conducted by using test samples such as shown in FIGS. 18 and 19 in order to compare electronic shading damages when a $WSi_2$/polysilicon lamination film is dry-etched by using a resist mask having a thickness of 1.8 $\mu$m with electronic shading damages when a $WSi_2$/polysilicon lamination film is dry-etched by using a TiON layer mask having a thickness of 40 nm and the direction <200>. For the general background of a damage test, for example, refer to U.S. Ser. No. 08/926,331 filed on Sep. 5, 1997, and U.S. Ser. No. 08/926,290 filed on Sep. 5, 1997, which are herein incorporated by reference.

The test sample has a metal-nitride-oxide-semiconductor (NMOS) capacitor and a dummy pattern of a line-and-space shape disposed around the NMOS capacitor. FIG. 18 is a plan view of the test sample, and FIG. 19 is a cross sectional view of the test sample taken along line X-X' of FIG. 18. A rectangular polysilicon electrode layer 74 is formed on an insulating film 72 formed on the surface of an n-type silicon substrate 70. The insulating film 72 is a lamination of an SiO$_2$ film and an Si$_3$N$_4$ formed on the SiO$_2$ film. An SiO$_2$ 76 is formed covering the electrode layer 74 and insulating film 72, and a connection hole is formed in the SiO$_2$ film 76 in an area corresponding to the central area of the electrode layer 74. A polysilicon layer 78a and a WSi$_2$ layer 78b are sequentially deposited by CVD, covering the SiO$_2$ 76 and filling the inside of the connection hole to thereby form a WSi$_2$/polysilicon lamination layer 78. On this WSi$_2$/polysilicon lamination layer 78, a TiON layer is formed through reactive sputtering, the TiON layer having a thickness of 40 nm and containing the direction <200>. On this TiON layer, resist layers 82, and 82A to 82D having a thickness of 1.8 μm and a plan pattern shown in FIG. 18 are formed. By using these resist layers 82, and 82A to 82D as masks, the TiON layer is patterned through dry etching to leave TiON layers 80, and 80A to 80D (80B and 80D are not shown in FIG. 19) corresponding to the resist layers 82, and 82A to 82D.

With the dry etching using the resist layers 82, and 82A to 82D as the masks, the WSi$_2$/polysilicon lamination layer 78 under the TiON layers is also patterned to leave portions of the lamination layer 78 corresponding to the resist layers 82, and 82A to 82D. Thereafter, the resist layers are removed. This method is herein called a first patterning method.

Another method of patterning the WSi$_2$/polysilicon lamination layer 78 is as in the following, which method is herein called a second patterning method. After the TiON layer is etched, the resist layers 82, and 82A to 82D are removed. By using the left TiON portions 80, and 80A to 80D as a mask, the WSi$_2$/polysilicon lamination layer 78 is patterned through dry etching to leave the portions of the lamination layer 78 corresponding to the left TiON portions 80, and 80A to 80D. The etcher shown in FIG. 17 was used for both the first and second patterning methods, and the etching conditions were set as:
Pressure: 1 mTorr
Microwave: 1800 W
Radio Frequency Power: 40 W
Gas Flow Rate: Cl$_2$/O$_2$=25/11 sccm An NMOS capacitor is constituted of the rectangular TiON layer 80, a rectangular WSi$_2$/polysilicon layer 78A portion left under the TiON layer 80, polysilicon electrode layer 74, insulating film 72, and silicon substrate 70. A dummy pattern of a line-and-space shape conformal to the resist layers 82A to 82D is disposed around the NMOS capacitor. Each line of the dummy pattern is constituted of the TiON layer portions 80A to 80D and WSi$_2$/polysilicon layer 78A portions left under the TiON layer portions. The size of the rectangular TiON layer 80 was set to 500 μm×500 μm, and the line and space widths of the dummy pattern were set to 1 μm and 1.5 μm, respectively.

In addition to test samples of the first type having the dummy pattern described above, test samples of the second type without the dummy pattern were prepared.

For the test samples of the first type, flat band voltages V$_{fb11}$ and V$_{fb12}$ before and after the WSi$_2$/polysilicon lamination layer 78 is dry-etched by the first and second patterning methods were measured to obtain a shift amount S$_1$=V$_{fb12}$-V$_{fb11}$. For the test samples of the second type, flat band voltages V$_{fb21}$ and V$_{fb22}$ before and after the WSi$_2$/polysilicon lamination layer 78 is dry-etched by the first and second patterning methods were measured to obtain a shift amount S$_2$=V$_{fb22}$-V$_{fb21}$. A difference ΔS=S$_1$-S$_2$ of the shift amounts between the first and second test samples was calculated. This difference is herein called a V$_{fb}$ shift increase amount. Table 2 shows the V$_{fb}$ shift increase amounts of the first patterning method (using a resist layer having a thickness of 1.8 μm as a mask) and the second patterning method (using a TiON layer having a thickness of 40 nm as a mask).

TABLE 2

| Patterning Method | Increase in V$_{fb}$ Shift [V] |
|---|---|
| 1st Method | 0.110 |
| 2nd Method | -0.009 |

The larger the V$_{fb}$ shift increase amount, the larger the electronic shading damages are. It can be understood from Table 2 that the second patterning method of this embodiment suppresses damages more than the first patterning method.

Figure 20:
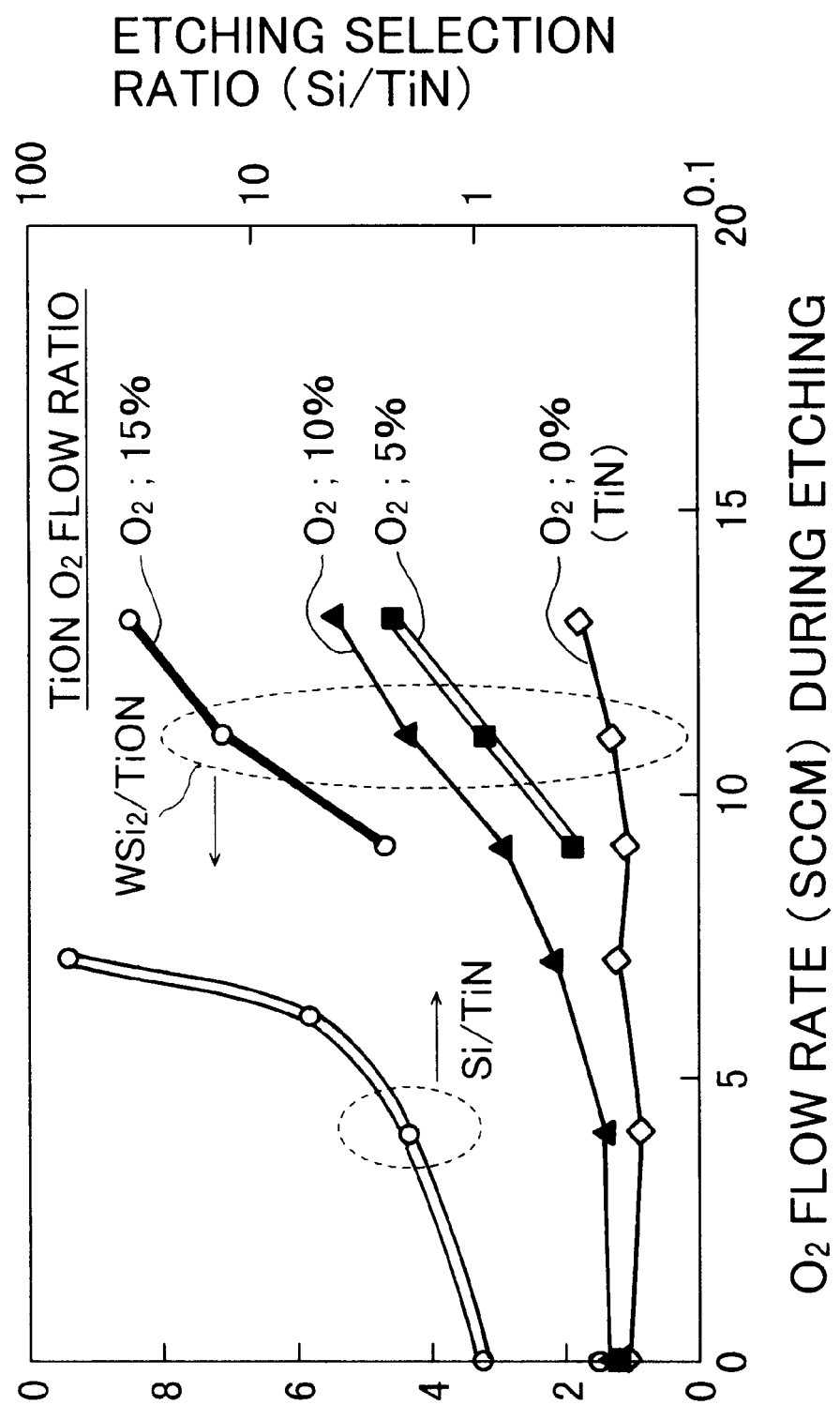
FIG. 20 is a graph showing an etching selection ratio dependency upon an $O_2$ flow rate.

FIG. 20 is a graph showing an etching selection ratio dependency upon an O$_2$ flow rate. The abscissa represents an O$_2$ flow rate [sccm] during etching, the left ordinate represents an etching selection ratio (SWi$_2$/TiON) of WSi$_2$ to TiON, and the right ordinate represents an etching selection ratio (Si/TiN) of Si to TiN.

The TiON layer containing the direction <200> was formed by using a DC magnetron sputtering system and Ti as a target. The reactive sputtering conditions were set as:
Pressure: 4 mTorr
Gas Flow Rate:
N$_2$=84 sccm,
Ar+O$_2$=56 sccm
DC Power: 5 kW A TiON/O$_2$ flow ratio of sputtered TiON to flowed O$_2$ was calculated by the following equation.

(O$_2$ flow rate/total flow rate of N$_2$+Ar+O$_2$)×100 [%]

Samples of four types were prepared, with the O$_2$ flow ratio being set to 0, 5, 10, and 15%. Samples of the O$_2$ flow ratio 0% have TiN layers containing the direction <111>, instead of TiON layers. As the O$_2$ flow ratio increases, oxygen contents increase, a TiN layer changes to a TiON Layer, and the direction <111> becomes weak whereas the direction <200> becomes strong, so that a TiON layer has a random distribution of the directions <200> and <111>.

Etching was performed by using the etcher shown in FIG. 17. The etching conditions were set as:
Pressure: 1 mTorr
Microwave Power: 1400 W
Radio Frequency Power: 45 W
Gas Flow Rate:
Cl$_2$=25 sccm,
O$_2$=0 to 13 sccm It can be understood from FIG. 20 that as the O$_2$ flow rate increases, the etching selection ratios Si/TiN and Si$_2$/TiON are improved. It can also be understood that the etching selection ratio WSi$_2$/TiN for the TiN layer with the O$_2$ flow ratio 0% is not improved even if the O$_2$ flow rate is increased. As the O$_2$ flow ratio of sputtered TiON is increased, the direction <200> becomes strong, and as the O$_2$ flow rate of etching is increased, the etching selection ratio WSi$_2$/TiON is improved. It is preferable to form a TiON layer through sputtering at the O$_2$ flow ratio of 5% or higher, more preferably 10% or higher, or much more preferably 15% or higher.

According to the experiments made by the inventors, when WSi$_2$ is etched by using a TiON layer as a mask, a proper O$_2$ flow rate is 9 sccm or higher at Cl$_2$ of 25 sccm.

The invention is not limited only to the above embodiments, but various modifications are possible. For example, the invention is applicable not only to dry etching of a polycide layer such as a WSi$_2$/polysilicon lamination layer but also to dry etching of a single layer of refractory metal silicide such as WSi$_2$ and a lamination of refractory metal silicide.

The present invention has been described in connection with the preferred embodiments. The invention is not limited only to the above embodiments. It is apparent that various modifications, improvements, combinations, and the like can be made by those skilled in the art.

What is claimed is:

1. A method of forming a conductive layer comprising the steps of:

(a) forming a first conductive lamination layer on an insulating film covering a substrate, the first conductive layer being made of refractory metal silicide at least at an uppermost layer of the first conductive lamination layer;

(b) forming a second conductive layer for antireflection on the first conductive lamination layer through photolithography, the second conductive layer being made of TiN or TiON and containing a direction <200> of the Miller indices notation;

(c) forming a resist film having a desired pattern on the second conductive layer through photolithography;

(d) patterning the second conductive layer through dry etching using the resist layer as a mask to partially leave the second conductive layer; and (e) patterning the first conductive lamination layer through dry etching using the resist layer and/or the left portion of the second conductive layer as a mask to partially leave the first conductive lamination layer, wherein a lamination of a left portion of the first conductive lamination layer and the left portion of the second conductive layer is used as a conductive layer for an electrode or a wiring layer.

2. A method of forming a conductive layer according to claim 1, further comprising:

(f) removing the resist layer after said step (d) and before said step (e), wherein said step (e) performs the dry etching by using the left portion of the second conductive layer as a mask.

3. A method of forming a conductive layer according to claim 1, wherein said step (e) performs the dry etching by using a lamination of the resist layer and the left portion of the second conductive layer as a mask to leave the portion of the first conductive layer and remove the resist layer.

4. A method of forming a conductive layer according to claim 1, wherein said step (b) forms the second conductive layer for antireflection, the second conductive layer being made of TiON containing the direction <200>.

5. A method of forming a conductive layer according to claim 1, wherein the substrate is a semiconductor substrate.

6. A method of forming a conductive layer according to claim 1, wherein said step (a) forms the first conductive lamination layer having the uppermost layer made of WSi$_2$.

7. A method of forming a conductive layer according to claim 1, wherein said step (c) forms the resist layer having a thickness sufficient for patterning the second conductive layer and insufficient for patterning the first conductive lamination layer.

8. A method of forming a conductive layer according to claim 3, wherein said step (c) forms the resist layer having a thickness sufficient for patterning the second conductive layer and insufficient for patterning the first conductive lamination layer.

9. A method of forming a conductive layer according to claim 4, wherein said step (b) forms the second conductive layer for antireflection made of TiON through sputtering.

10. A method of forming a conductive layer according to claim 5, wherein the semiconductor substrate is a silicon substrate.

11. A method of forming a conductive layer according to claim 6, wherein said step (a) forms the first conductive lamination layer having a polysilicon layer under the WSi$_2$ layer.

12. A method of forming a conductive layer according to claim 9, wherein said step (b) forms the second conductive layer for antireflection made of TiON through reactive sputtering at an oxygen gas flow rate of 20% or larger relative to a total gas flow rate.

13. A method of forming a conductive layer according to claim 9, wherein said step (b) forms the second conductive layer for antireflection made of TiON through reactive sputtering at an oxygen gas flow rate of 5% or larger relative to a total gas flow rate of oxygen, nitrogen, and argon gases.

14. A method of forming a conductive layer according to claim 9, wherein said step (b) forms the second conductive layer for antireflection made of TiON through reactive sputtering at an oxygen gas flow rate of 10% or larger relative to a total gas flow rate of oxygen, nitrogen, and argon gases.

15. A method of forming a conductive layer according to claim 9, wherein said step (b) forms the second conductive layer for antireflection made of TiON through reactive sputtering at an oxygen gas flow rate of 15% or larger relative to a total gas flow rate of oxygen, nitrogen, and argon gases.

16. A method of forming a conductive layer according to claim 1, wherein said step (b) forms the second conductive layer for antireflection made of TiN or TiON having an intensity at 2θ corresponding to the direction <200> in an x-ray diffraction pattern which intensity is 50% of, or higher than, an intensity at 2θ corresponding to a direction <111>.

17. A method of forming a conductive layer according to claim 1, wherein said step (b) forms the second conductive layer for antireflection made of TiN or TiON having an intensity at 2θ corresponding to the direction <200> in an x-ray diffraction pattern which intensity is 100% of, or higher than, an intensity at 2θ corresponding to a direction <111>.

18. A method of forming a conductive layer according to claim 1, wherein said step (b) forms the second conductive layer for antireflection made of TiN or TiON having an intensity at 2θ corresponding to the direction <200> in an x-ray diffraction pattern which intensity is 150% of, or higher than, an intensity at 2θ corresponding to a direction <111>.

19. A method of forming a conductive layer according to claim 1, wherein said step (b) forms the second conductive layer for antireflection made of TiN and containing the direction <200>.

* * * * *